(12) United States Patent
Mikhael et al.

(10) Patent No.: US 12,080,475 B2
(45) Date of Patent: Sep. 3, 2024

(54) INDUCTOR ARRANGEMENTS

(71) Applicant: SOCIONEXT INC., Kanagawa (JP)

(72) Inventors: David Hany Gaied Mikhael, Langen (DE); Bernd Hans Germann, Langen (DE)

(73) Assignee: SOCIONEXT INC., Kanagawa (JP)

( * ) Notice: Subject to any disclaimer, the term of this patent is extended or adjusted under 35 U.S.C. 154(b) by 704 days.

(21) Appl. No.: 17/088,379

(22) Filed: Nov. 3, 2020

(65) Prior Publication Data

US 2021/0193378 A1 Jun. 24, 2021

(30) Foreign Application Priority Data

Dec. 20, 2019 (EP) ..................................... 19219092

(51) Int. Cl.
*H01F 27/34* (2006.01)
*H01L 49/02* (2006.01)
(52) U.S. Cl.
CPC ........... *H01F 27/345* (2013.01); *H01L 28/10* (2013.01)
(58) Field of Classification Search
USPC ............................................ 336/84, 221, 83
See application file for complete search history.

(56) References Cited

U.S. PATENT DOCUMENTS

| | | | |
|---|---|---|---|
| 2006/0220778 A1 | 10/2006 | Marques | |
| 2008/0074228 A1 | 3/2008 | Erickson et al. | |
| 2012/0056297 A1* | 3/2012 | Akhtar | H01F 27/29 257/E21.022 |
| 2013/0038281 A1* | 2/2013 | Sakakibara | H02J 50/70 320/108 |
| 2014/0140028 A1* | 5/2014 | Lenive | H01L 23/5227 361/782 |
| 2015/0065068 A1* | 3/2015 | Mattsson | H01F 27/2804 336/200 |
| 2016/0126000 A1* | 5/2016 | Han | H01F 27/28 336/220 |
| 2016/0254800 A1 | 9/2016 | Dedic et al. | |
| 2016/0276097 A1 | 9/2016 | Lewis | |
| 2017/0243690 A1* | 8/2017 | Chen | H01F 27/346 |
| 2018/0351528 A1* | 12/2018 | Liu | H01F 17/0006 |
| 2019/0088734 A1* | 3/2019 | Yen | H01L 23/5227 |
| 2019/0103458 A1 | 4/2019 | Mattsson et al. | |

OTHER PUBLICATIONS

Extended European Search Report issued Jun. 9, 2020 in European Application No. 19219092.4.

* cited by examiner

*Primary Examiner* — Shawki S Ismail
*Assistant Examiner* — Kazi S Hossain
(74) *Attorney, Agent, or Firm* — Rimon P.C.

(57) ABSTRACT

An inductor arrangement, comprising: a first pair of driven inductors configured to be driven to generate magnetic fields which are substantially in antiphase, and arranged relative to one another so that their magnetic fields substantially cancel one another at a first null line between those inductors; and a second pair of driven inductors configured to produce magnetic fields which are substantially in antiphase, and arranged relative to one another so that their magnetic fields substantially cancel one another at a second null line between those inductors, wherein the pairs of driven inductors are arranged relative to one another so that the first and second null lines intersect one another, with the first pair of driven inductors located substantially on the second null line and the second pair of inductors located substantially on the first null line.

5 Claims, 7 Drawing Sheets

INDUCTOR ARRANGEMENTS

CROSS-REFERENCE OF RELATED APPLICATIONS

This application claims the benefit of European Patent Application No. 19219092.4, filed on Dec. 20, 2019, the entire disclosure of which Application is incorporated by reference herein.

The present invention relates to inductor arrangements. Such inductor arrangements may be implemented in integrated circuitry, for example on an IC chip. Inductors in such inductor arrangements produce fluctuating magnetic fields when driven with suitable driving signals which can affect other circuitry through magnetic coupling, including other inductors of the inductor arrangement.

With increasing speeds of circuitry which may implement such inductor arrangements, and corresponding miniaturization of semiconductor devices, there is ever increasing pressure on operating such circuitry accurately. This includes addressing the problem of unwanted magnetic coupling.

According to an embodiment of a first aspect of the present invention, there is provided an inductor arrangement, comprising: a first pair of driven inductors configured to be driven to generate magnetic fields which are substantially in antiphase, and arranged relative to one another so that their magnetic fields substantially cancel one another at a first null line between those inductors; and a second pair of driven inductors configured to produce magnetic fields which are substantially in antiphase, and arranged relative to one another so that their magnetic fields substantially cancel one another at a second null line between those inductors, wherein the pairs of driven inductors are arranged relative to one another so that the first and second null lines intersect one another, with the first pair of driven inductors located substantially on the second null line and the second pair of inductors located substantially on the first null line.

The inductor arrangement enables magnetic coupling between the first and second pairs of driven inductors to be reduced or removed.

The driven inductors are driven (e.g. through connection to driving circuitry) in the sense that they are configured to be driven by driving signals, e.g. driving voltage signals or currents (such as AC driving currents).

The first pair of driven inductors may be connected together to be driven by the same first driving signal. The second pair of driven inductors may be connected together to be driven by the same second driving signal. A phase difference between the first and second driving signals may be substantially 90 or 270 degrees.

The driven inductors of the first and second pairs may be configured to be driven so that first and third magnetic fluxes generated by the inductors of the first pair, respectively, are equal (and opposite) to one another, and so that second and fourth magnetic fluxes generated by the inductors of the second pair, respectively are equal (and opposite) to one another (so that the first and second null lines are straight).

The first pair of driven inductors may be configured such that the first null line is straight. The second pair of driven inductors may be configured such that the second null line is straight.

The driven inductors of the first and second pairs may each have one or more turns. The driven inductors of the first and second pairs may be spiral inductors. The first pair of driven inductors may have the same size and number of turns as one another. The second pair of driven inductors may have the same size and number of turns as one another.

The direction of the turns of the driven inductors may be configured so that they produce their respective magnetic fields. The first pair of driven inductors may be connected together so that those driven inductors produce their respective magnetic fields, and the second pair of driven inductors may be connected together so that those driven inductors produce their respective magnetic fields.

The positions of the driven inductors of the first and second pairs may define four corners of a rhombus, the driven inductors of the first pair being opposite from one another in the arrangement.

The driven inductors of the first and second pairs may be differential inductors. The driven inductors may be centre-tapped at centre-tap nodes. The centre-tap nodes of the driven inductors of the first pair may be arranged symmetrically opposite from one another with respect to the first null line and the centre-tap nodes of the driven inductors of the second pair may be arranged symmetrically opposite from one another with respect to the second null line.

The centre-tap nodes of the first pair of driven inductors may be located substantially on the second null line and the centre tap nodes of the second pair of driven inductors may be located substantially on the first null line.

The centre-tap nodes of the driven inductors of the first pair may be connected together and the centre-tap nodes of the driven inductors of the second pair may be connected together.

The driven inductors may have positive and negative terminals. The positive terminals of the driven inductors of the first pair may be connected together, and the negative terminals of the driven inductors of the first pair may be connected together. The positive terminals of the driven inductors of the second pair may be connected together, and the negative terminals of the driven inductors of the second pair may be connected together.

The positive terminals of the driven inductors of the first pair may be located on the same side of the second null line as one another and the negative terminals of the driven inductors of the first pair may be located on the same side of the second null line as one another. The positive terminals of the driven inductors of the second pair may be located on the same side of the first null line as one another and the negative terminals of the driven inductors of the second pair may be located on the same side of the first null line as one another.

The positive and negative terminals of each driven inductor of the first pair may be located on opposite sides of the second null line from one another. The positive and negative terminals of each driven inductor of the second pair may be located on opposite sides of the first null line from one another.

The respective phases of the magnetic fields generated by the driven inductors of the first and second pairs of inductors may be substantially in quadrature.

The first pair of driven inductors may be connected together to be driven by the same first driving signal. The second pair of driven inductors may be connected together to be driven by the same second driving signal.

The driven inductors of the first pair may be configured to be driven to generate magnetic fields having first and third phases, respectively, and the driven inductors of the second pair may be configured to be driven to generate magnetic fields having second and fourth phases, respectively, and the first to fourth phases may be substantially in quadrature.

According to an embodiment of a second aspect of the present invention, there is provided an inductor arrangement, comprising: a first pair of driven inductors connected together to be driven by the same first driving signal, configured relative to one another to generate magnetic fields which are substantially in antiphase, and arranged relative to one another so that their magnetic fields substantially cancel one another at a first null line between those inductors; and a second pair of driven inductors connected together to be driven by the same second driving signal, configured relative to one another to generate magnetic fields which are substantially in antiphase, and arranged relative to one another so that their magnetic fields substantially cancel one another at a second null line between those inductors, wherein the pairs of driven inductors are arranged relative to one another so that the first and second null lines intersect one another, with the first pair of driven inductors located substantially on the second null line and the second pair of inductors located substantially on the first null line.

According to an embodiment of a third aspect of the present invention, there is provided an inductor arrangement comprising: a driven inductor configured to be driven by a driving current to generate a driven magnetic field; an auxiliary loop, being a closed (or endless) AC and/or DC current path; and a target circuit, wherein the auxiliary loop is located between the driven inductor and the target circuit.

The inductor arrangement enables magnetic coupling from the driven inductor to the target circuit to be reduced or removed.

The auxiliary loop may be implemented as an inductor.

The auxiliary loop may be configured so that AC currents induced therein will circulate (fully) around the loop.

The auxiliary loop may be equidistant between the driven inductor and the target circuit. The driven inductor, the auxiliary loop, and the target circuit may be located at respective positions on a straight line.

The auxiliary loop may be a single turn loop or a multi-turn loop. The auxiliary loop may be formed of an elongate conductor whose ends are connected together. The auxiliary loop may comprise at least one elongate conductor and at least one capacitor connected in series to form the loop. The one or more capacitors may be implemented as breaks or gaps between ends of the conductor or conductors. The number and/or sizes of the breaks/gaps may be configured to control a strength of the or each auxiliary magnetic field.

The auxiliary loop may be electrically undriven. The auxiliary loop may be electrically undriven by an AC electrical signal. The auxiliary loop may be configured to be electrically connected to a DC voltage source (electrically connected may be conductively connected).

The driven inductor, the auxiliary loop, and the target circuit may be located relative to each other so that: a current is induced in the auxiliary loop by the driven magnetic field, the induced current causing the auxiliary loop to generate an auxiliary magnetic field of opposite polarity (or opposite phase) to the driven magnetic field; and the auxiliary magnetic field destructively interferes with the driven magnetic field at the target circuit to reduce magnetic coupling from the driven inductor to the target circuit.

The driven inductor may be a first driven inductor, the driving current may be a first driving current, the driven magnetic field may be a first driven magnetic field, and the target circuit may be a second driven inductor configured to be driven by a second driving current to generate a second driven magnetic field.

The inductor arrangement enables magnetic coupling between the first driven inductor and the second driven inductor to be reduced or removed.

The first and second driving currents may have AC components which have first and second different phases, respectively. The first and second phases may not be in antiphase. A phase difference between the first and second phases may be substantially 90 or 270 degrees.

The first and second driven inductors may have the same size and number of turns as one another. The first and second driven inductors may be spiral inductors.

The first driven inductor, the auxiliary loop, and the second driven inductor may be located relative to each other so that: a current is induced in the auxiliary loop by the second driven magnetic field, that induced current causing the auxiliary loop to generate a second auxiliary magnetic field of opposite polarity (or opposite phase) to the second driven magnetic field; and the second auxiliary magnetic field destructively interferes with the second driven magnetic field at the first driven inductor to reduce magnetic coupling from the second driven inductor to the first driven inductor.

The or each driven inductor and/or the auxiliary loop may be implemented in one or more parallel planes. The or each driven inductor and/or the auxiliary loop may be a planar component.

The or each driven inductor and the auxiliary loop may be components which respectively comprise one or more complete or partial turns which define core axes of those components. The core axes of the or at least one of the driven inductors and of the auxiliary loop may be substantially parallel.

The or each driven inductor or one of the driven inductors may be a differential inductor.

The direction of the turns of the or each driven inductor may be configured so that it produces its magnetic field. The or each driving current may be configured so that the corresponding driven inductor produces its magnetic field.

The inductor arrangement may be implemented in integrated circuitry having one or more layers, and the or each said driven inductor and the auxiliary loop may each be formed in only one said layer or across a plurality of said layers.

According to an embodiment of a fourth aspect of the present invention, there is provided an inductor arrangement comprising: a first driven inductor configured to be driven by a first driving current to generate a first driven magnetic field; an auxiliary loop, being a closed (or endless) AC and/or DC current path; and a second driven inductor configured to be driven by a second driving current to generate a second driven magnetic field, wherein the auxiliary loop is located between the first driven inductor and the second driven inductor.

The inductor arrangement enables magnetic coupling between the first driven inductor and the second driven inductor to be reduced or removed.

According to an embodiment of a fifth aspect of the present invention, there is provided an inductor arrangement comprising: a driven inductor configured to be driven by a driving current to generate a driven magnetic field; an auxiliary loop; and a target circuit, wherein the driven inductor, the auxiliary loop, and the target circuitry are located relative to each other so that: a current is induced in the auxiliary loop by the driven magnetic field, the induced current causing the auxiliary loop to generate an auxiliary magnetic field of opposite polarity (or opposite phase) to the driven magnetic field; and the auxiliary magnetic field destructively interferes with the driven magnetic field at the target circuit to reduce magnetic coupling from the driven inductor to the target circuit.

The inductor arrangement enables magnetic coupling from the driven inductor to the target circuit to be reduced or removed.

The driven inductor may be a first driven inductor, the driving current may be a first driving current, the driven magnetic field may be a first driven magnetic field, the auxiliary magnetic field may be a first auxiliary magnetic field, and the target circuit may be a second driven inductor configured to be driven by a second driving current to generate a second driven magnetic field.

The inductor arrangement enables magnetic coupling between the first driven inductor and the second driven inductor to be reduced or removed.

The first driven inductor, the auxiliary loop, and the second driven inductor may be located relative to each other so that: a current is induced in the auxiliary loop by the second driven magnetic field, that induced current causing the auxiliary loop to generate a second auxiliary magnetic field of opposite polarity to the second driven magnetic field; and the second auxiliary magnetic field destructively interferes with the second driven magnetic field at the first driven inductor to reduce magnetic coupling from the second driven inductor to the first driven inductor.

The first and second driving currents may have AC components which have first and second different phases, respectively. The first and second phases might not be in antiphase. A phase difference between the first and second phases may be substantially 90 or 270 degrees.

The inductor arrangement may comprise driving circuitry configured to drive each driven inductor.

The inductor arrangement may be implemented in integrated circuitry having one or more layers, and each said inductor may be formed in only one said layer or across a plurality of said layers.

Said magnetic fields may be fluctuating or alternating fields.

According to an embodiment of a sixth aspect of the present invention, there is provided oscillator circuitry, such as voltage-controlled oscillator circuitry comprising the inductor arrangement of any of the first to fifth aspects.

According to an embodiment of a seventh aspect of the present invention, there is provided I/Q circuitry, such as I/Q clock buffer circuitry or I/Q voltage-controlled oscillator circuitry, comprising the inductor arrangement of any of the first to fifth aspects.

According to an embodiment of an eighth aspect of the present invention, there is provided integrated circuitry such as an IC chip comprising the inductor arrangement of any of the first to fifth aspects, or the circuitry of the sixth or seventh aspects.

Features of any of the above aspects may be applied to any others of the above aspects.

Reference will now be made, by way of example, to the accompanying drawings, of which:

Figure 1:
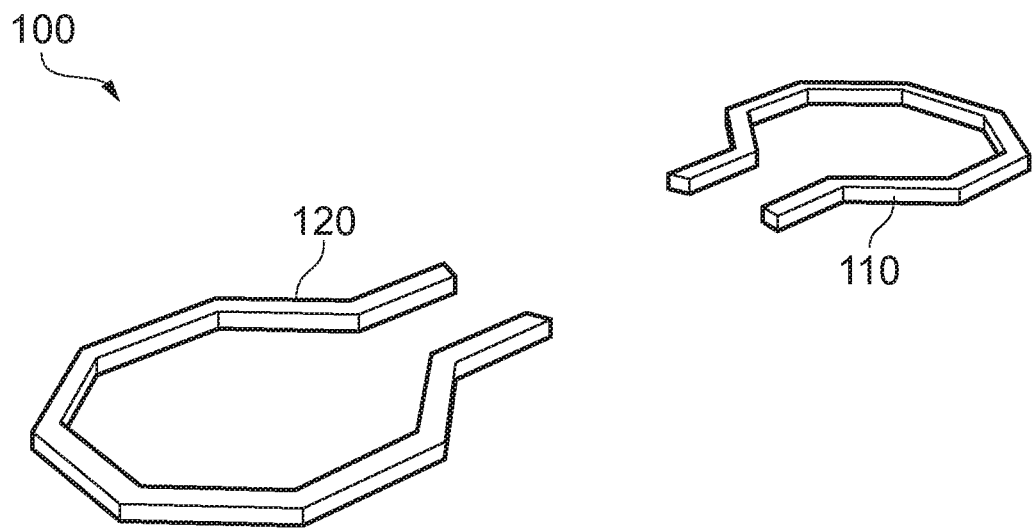
FIG. 1 is a schematic diagram of an inductor arrangement useful for understanding the present invention.

FIG. 1 is a schematic diagram of an inductor arrangement 100 as a comparative example. Inductor arrangement 100 comprises first and second inductors 110 and 120. The inductors 110 and 120 could be part of, or even be, transformers, and the following description would apply equally in that case.

The inductors 110 and 120 are, in use, driven by driving signals, for example provided by other circuitry (not shown). Those driving signals cause currents to flow in the inductors which generate magnetic fields in and around the inductors 110 and 120. In other words, when driven the inductors 110 and 120 generate respective magnetic fields. The inductors 110 and 120 are positioned in close proximity to one another so that their magnetic fields interact with one another, as explained more fully below.

Figure 2:
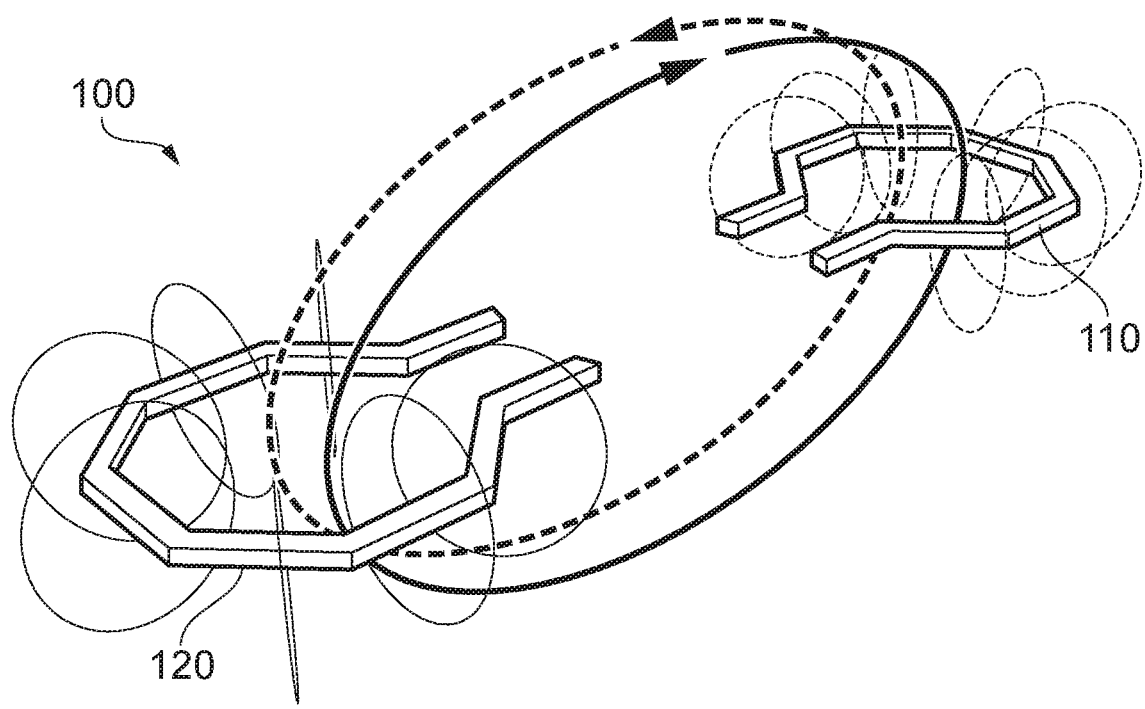
FIG. 2 is a schematic diagram of an inductor arrangement useful for understanding the present invention.

FIG. 2 is a schematic diagram of the inductor arrangement 100 and shows (in simplified, schematic form) magnetic field lines of the magnetic fields generated by the inductors 110 and 120, given corresponding driving signals. The dashed lines indicate the magnetic field generated by the first inductor 110. The solid lines indicate the magnetic field generated by the second inductor 120. The magnetic field lines may be referred to as magnetic flux lines. The magnetic flux lines are represented as closed rings surrounding the tracks or conductors of the inductors 110 and 120.

Due to the close proximity of the inductors 110 and 120, relatively strong magnetic field lines from the first inductor 110 reach (and couple with) the second inductor 120 as shown. That is, the magnetic field generated by the first inductor 110 is present at the location of the second inductor 120. As a result, the magnetic field generated by the first inductor 110 generates back-EMF in the second inductor 120. This generated back-EMF interferes with the current flowing through the second inductor 120 (and can impact the driving signal driving the second inductor 120).

Similarly, relatively strong magnetic field lines from the second inductor 120 reach (and couple with) the first inductor 110 as shown. That is, the magnetic field generated by the second inductor 120 is present at the location of the first inductor 110 and generates back-EMF in the first inductor 110 which interferes with the current flowing through the first inductor 110 (and can impact the driving signal driving the first inductor 110).

The interference of the magnetic field generated by one of the inductors 110 and 120 with a current flowing through the other inductor 110 and 120 may be referred to as magnetic coupling and leads to many unwanted effects including frequency pulling, spurs, distortion and phase pulling. For example, the inductors 110 and 120 may be driven by respective driving signals (causing corresponding currents) which are out of phase (e.g. 90 or 270 degrees out of phase). In such a case, the magnetic coupling may cause the phases of the magnetic fields generated by the inductors 110 and 120 (which may referred to simply as the phases of the inductors 110 and 120) to be brought to or towards phases which are undesirable.

The inductors 110 and 120 may be driven by voltage signals with an AC component, which cause AC currents (or currents with an AC component) to flow through the inductors so that each inductor 110 and 120 generates an alternating or fluctuating magnetic field.

For example, the inductors 110 and 120 may be driven by a set of quadrature voltage signals, conveniently referred to as I, /I, Q and /Q, where these have respective (relative) phases 0, 180, 90 and 270 degrees. In this example, the I and /I signals may be applied to the respective terminals of the inductor 110, and the Q and /Q signals may be applied to the respective terminals of the inductor 120. The inductors 110 and 120 may be center tapped for example, although not shown.

In this example, the resultant currents flowing in the inductors 110 and 120 may be 90 or 270 degrees out of phase, and also the resultant magnetic fields generated by the inductors 110 and 120 may also be 90 or 270 degrees out of phase. Such an arrangement may be referred to as an I/Q arrangement.

Figure 13:
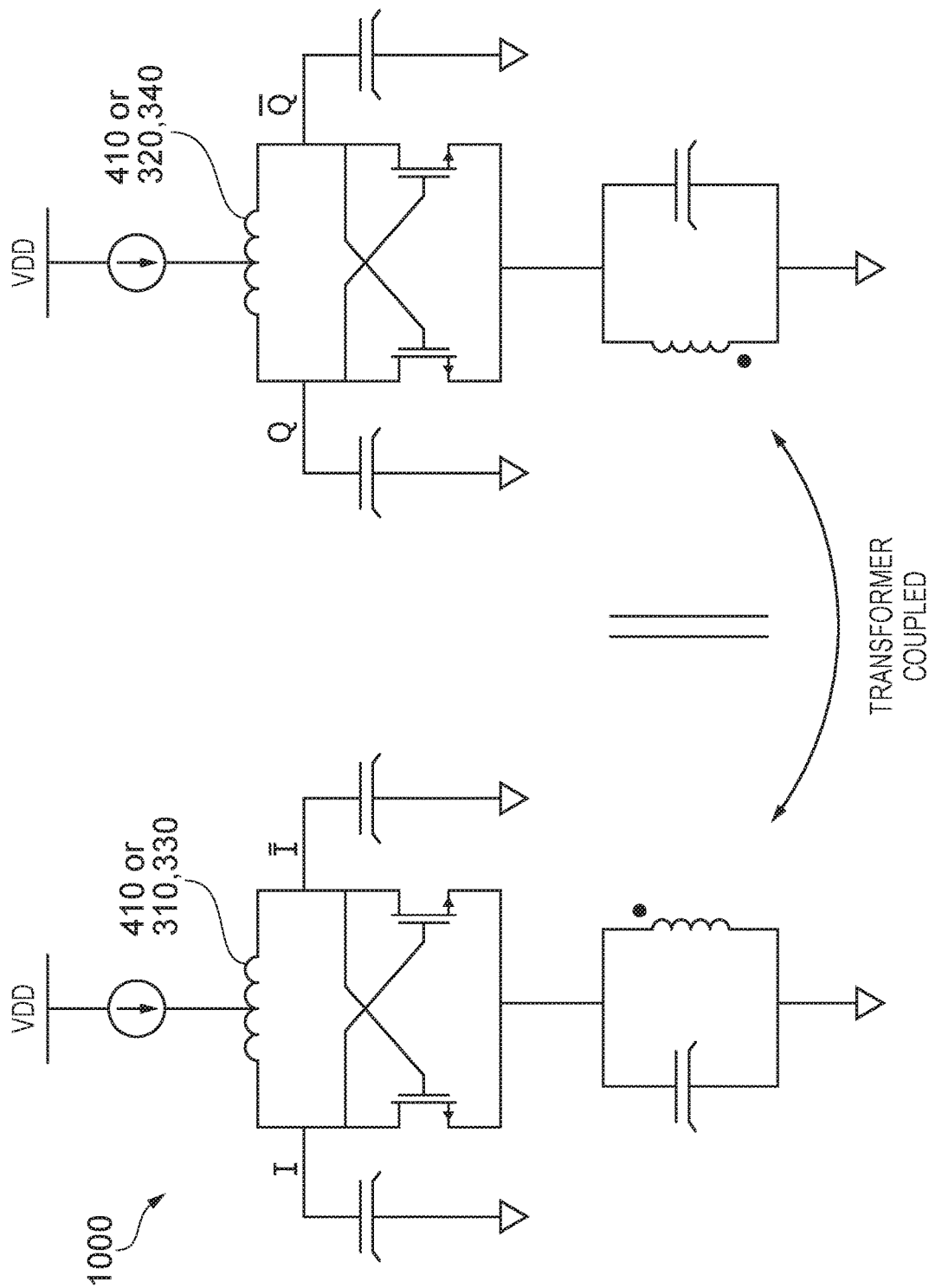
FIG. 13 is a schematic diagram of IQ oscillator circuitry.

When the inductors 110 and 120 in this case are implemented in an I/Q voltage-controlled oscillator (VCO), an example of which is shown in FIG. 13 to be described later, the quadrature phase relationship in the I/Q VCO can be destroyed due to the magnetic coupling. That is, the phases of the magnetic fields can diverge from their ideal values, and in an extreme case both I and Q cores can eventually end up with same phase or an antiphase relationship instead of 90 or 270 degrees phase difference. That is, the phase of the magnetic field generated by the first inductor 110 may, due to the magnetic coupling, become for example the same as the phase of the magnetic field generated by the second inductor 120.

Figure 3:
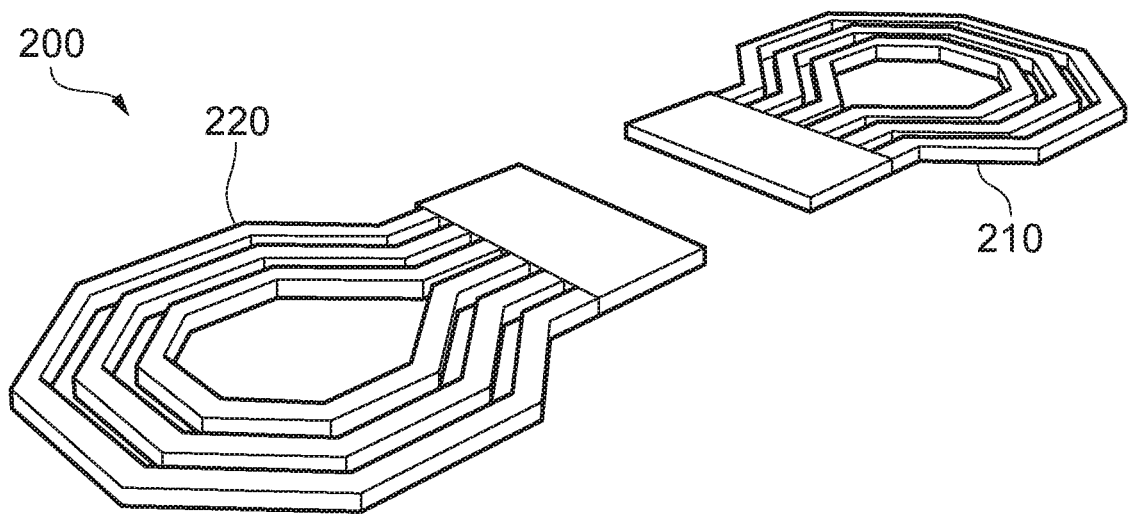
FIG. 3 is a schematic diagram of an inductor arrangement useful for understanding the present invention.
Figure 4:
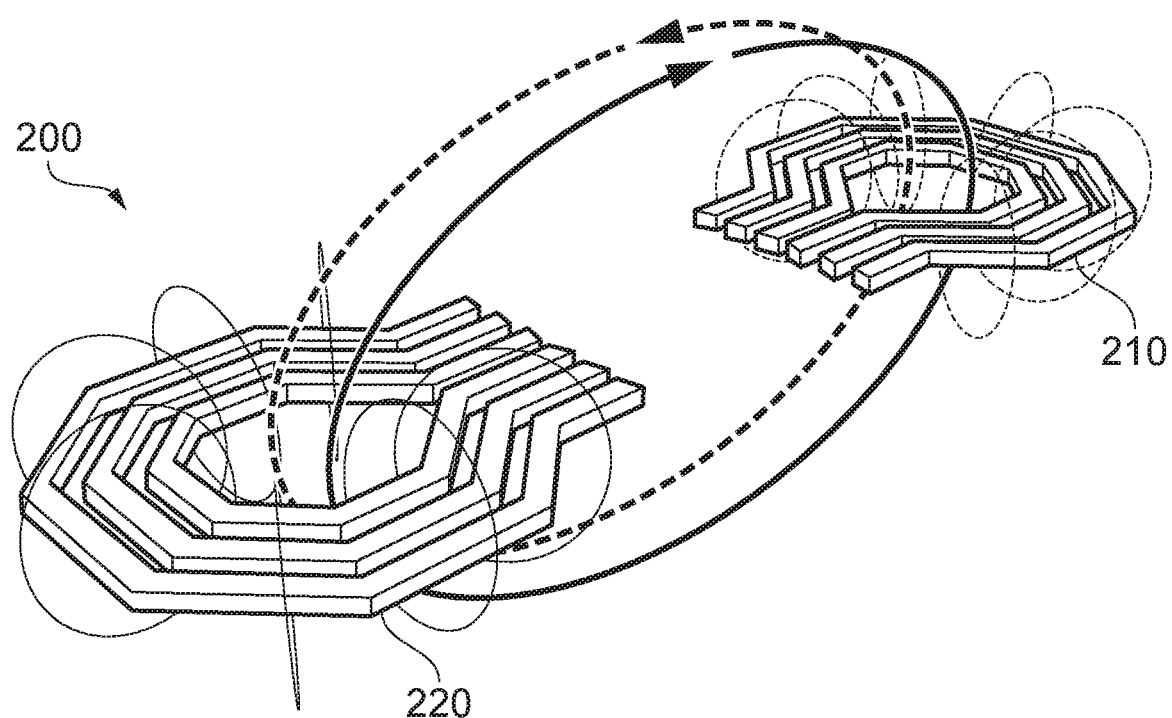
FIG. 4 is a schematic diagram of an inductor arrangement useful for understanding the present invention.

FIGS. 3 and 4 are schematic diagrams of another inductor arrangement 200 as a comparative example. FIG. 3 shows only the inductor arrangement 200, but FIG. 4 additionally shows magnetic field lines. Inductor arrangement 200 comprises first and second inductors 210 and 220. The description above in relation to the inductor arrangement 100 illustrated in FIGS. 1 and 2 applies analogously to the inductor arrangement 200 illustrated in FIGS. 3 and 4. The difference between the inductors of the inductor arrangement 200 compared to the inductors of the inductor arrangement 100 is that the inductors of the inductor arrangement 200 are shown as having multiple turns (three turns, in this example case).

As compared to FIG. 4, FIG. 3 also includes a schematic representation (in the form of boxes) of oscillator core circuitry connected to both inductors, for example to form an I/Q voltage-controlled oscillator (VCO) such as in FIG. 13.

The inductors 110, 120, 210 and 220 could be differential or non-differential inductors and the description above applies equally in either case.

Figure 5:
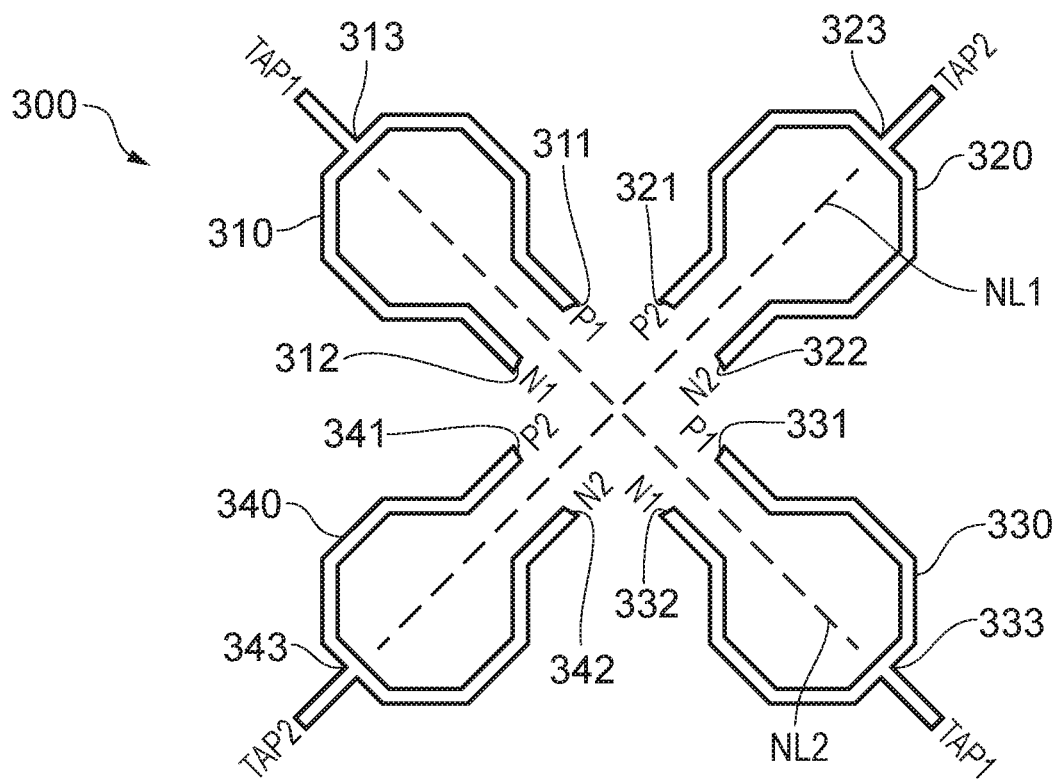
FIG. 5 is a schematic diagram illustrating a first example inductor arrangement.

FIG. 5 is a schematic diagram of a first example inductor arrangement 300 embodying the present invention.

Inductor arrangement 300 comprises first to fourth inductors 310, 320, 330 and 340. The first and third inductors 310 and 330 may be referred to as a first pair of inductors, and the second and fourth inductors 320 and 340 may be referred to as a second pair of inductors. The inductors 310, 320, 330 and 340 are differential inductors in the present example. The first to fourth inductors 310, 320, 330 and 340 are centre-tapped at first to fourth centre-tap nodes 313, 323, 333 and 343, respectively. The first to fourth inductors 310, 320, 330 and 340 have respective first to fourth positive nodes 311, 321, 331 and 341 (positive terminals) and respective first to fourth negative nodes 312, 322, 332 and 342 (negative terminals).

The first and third centre-tap nodes 313 and 333 are connected together (which is indicated by the labels "TAP1" in FIG. 5), and the second and fourth centre-tap nodes 323 and 343 are connected together (which is indicated by the labels "TAP2" in FIG. 5).

The first and third positive nodes 311 and 331 are connected together (which is indicated by the labels "P1" in FIG. 5), and the second and fourth positive nodes 321 and 341 are connected together (which is indicated by the labels "P2" in FIG. 5). The first and third negative nodes 312 and 332 are connected together (which is indicated by the labels "N1" in FIG. 5), and the second and fourth negative nodes 322 and 342 are connected together (which is indicated by the labels "N2" in FIG. 5).

Similarly to the above example with reference to the inductor arrangement 100, the inductors 310, 320, 330 and 340 may be driven by a set of quadrature voltage signals, conveniently referred to as I, /I, Q and /Q, where these have respective (relative) phases 0, 180, 90 and 270 degrees. In this example, the I and /I signals may be applied to the respective terminals P1 and N1, and the Q and /Q signals may be applied to the respective terminals P2 and N2, for example.

In this example, similar to before, the resultant currents flowing in the inductors 310 and 330 may be 90 or 270 degrees out of phase with the resultant currents flowing in the inductors 320 and 340, with the resultant magnetic fields generated by the inductors 310 and 330 being substantially in antiphase, the resultant magnetic fields generated by the inductors 320 and 340 being substantially in antiphase, and the resultant magnetic fields generated by the inductors 310 and 330 being 90 or 270 degrees out of phase with the resultant magnetic fields generated by the inductors 320 and 340. Such an arrangement may again be referred to as an I/Q arrangement.

The I, /I, Q and /Q signals may be referred to as driving voltage signals or driving signals. The resultant currents that drive the inductors may be referred to as driving currents or also driving signals. The inductors 310, 320, 330 and 340 may be referred to as driven inductors because they are configured to be driven to generate their respective magnetic fields.

The above operation may be understood better as follows.

Due to the connections of the centre-tap, positive and negative nodes of the inductors 310, 320, 330 and 340, the inductors 310 and 330 of the first pair are driven by the same current or driving signal (e.g. a first driving signal, which may be considered to apply to the combination of I and /I), and the inductors 320 and 340 of the second pair are driven by the same current or driving signal (e.g. a second driving signal, which may be considered to apply to the combination of Q and /Q).

Due to the connections between the centre-tap, positive and negative nodes of the inductors 310, 320, 330 and 340, and due to the directions of the windings or conductors of the inductors, the magnetic field generated by the first inductor 310 has, at any instant, a phase opposite to or in antiphase with the phase of the magnetic field generated by the third inductor 330 (and the magnetic fields have opposite polarities), and the magnetic field generated by the second inductor 320 has, at any instant, a phase opposite to or in antiphase with the phase of the magnetic field generated by the fourth inductor 340 (and the magnetic fields have opposite polarities).

Also due to the connections between the centre-tap, positive and negative nodes of the inductors 310, 320, 330 and 340, and due to the sizes and numbers of turns of the inductors, the magnetic field generated by the first inductor 310 is equal in strength at a line of symmetry between the inductors 310 and 330 of the first pair to the magnetic field generated by the third inductor 330, and the magnetic field generated by the second inductor 320 is equal in strength at a line of symmetry between the inductors 320 and 340 of the second pair to the magnetic field generated by the fourth inductor 340. That is, the current in the first inductor 310 generates a magnetic flux at the first inductor 310 equal (and opposite) to a magnetic flux in the third inductor 330 generated by the current in the third inductor 330. And the current in the second inductor 320 generates a magnetic flux at the second inductor 320 equal (and opposite) to a magnetic flux in the fourth inductor 340 generated by the current in the fourth inductor 340. The magnetic flux at an inductor 310, 320, 330 and 340 may equally be said herein to be generated by that inductor 310, 320, 330 and 340. In other words, first and third magnetic fluxes generated by the inductors 310 and 330 of the first pair, respectively, are equal (and opposite) to one another, and second and fourth magnetic fluxes generated by the inductors of the second pair, respectively are equal (and opposite) to one another.

Of course, it will be appreciated that the inductors need not be centre-tapped inductors, in which case the centre-tap nodes TAP1 and TAP2 would not be provided. In such a case, the first and third inductors 310 and 330 need not be connected together at centre-tap nodes TAP1 and the second and fourth inductors 320 and 340 need not be connected together at centre-tap nodes TAP2.

The magnetic field generated by the first inductor 310 is thus equal and opposite to the magnetic field generated by the third inductor 330 and these magnetic fields cancel out one another along a first null line NL1 directly between and equidistant from the first and third inductors 310 and 330. Similarly, the magnetic field generated by the second inductor 320 is equal and opposite to the magnetic field generated by the fourth inductor 330 and these magnetic fields cancel out one another along a second null line NL2 directly between and equidistant from the second and fourth inductors 320 and 340. The null lines NL1 and NL2 of course extend in either direction and are only shown to be relatively short in FIG. 5 for simplicity.

The first and third phases could be, for example, 0 and 180 degrees. The second and fourth phases could be, for example, 90 and 270 degrees. In this case, the first to fourth phases are in quadrature which is convenient for use in IQ circuitry, but this is not essential. For example, the first to fourth phases could be 0, 45, 180 and 225 degrees, respectively. The first and third phases could be substantially the same as the second and fourth phases, respectively. There are many possible phases for the first to fourth phases and the above list is not exhaustive.

The first pair of inductors 310 and 330 are located (or positioned) on the second null line NL2 and the second pair of inductors 320 and 340 are located on the first null line NL1. Therefore the effect at (the location of) the second pair of inductors 320 and 340 of the magnetic field generated by the first inductor 310 is substantially cancelled out or at least reduced by the effect at (the location of) the second pair of inductors 320 and 340 of the magnetic field generated by the third inductor 330. Similarly, the effect at (the location of) the first pair of inductors 310 and 330 of the magnetic field generated by the second inductor 320 is substantially cancelled out or at least reduced by the effect at (the location of) the first pair of inductors 310 and 330 of the magnetic field generated by the fourth inductor 340. This reduces coupling between the first pair of inductors 310, 330 and the second pair of inductors 320, 340.

Figure 6:
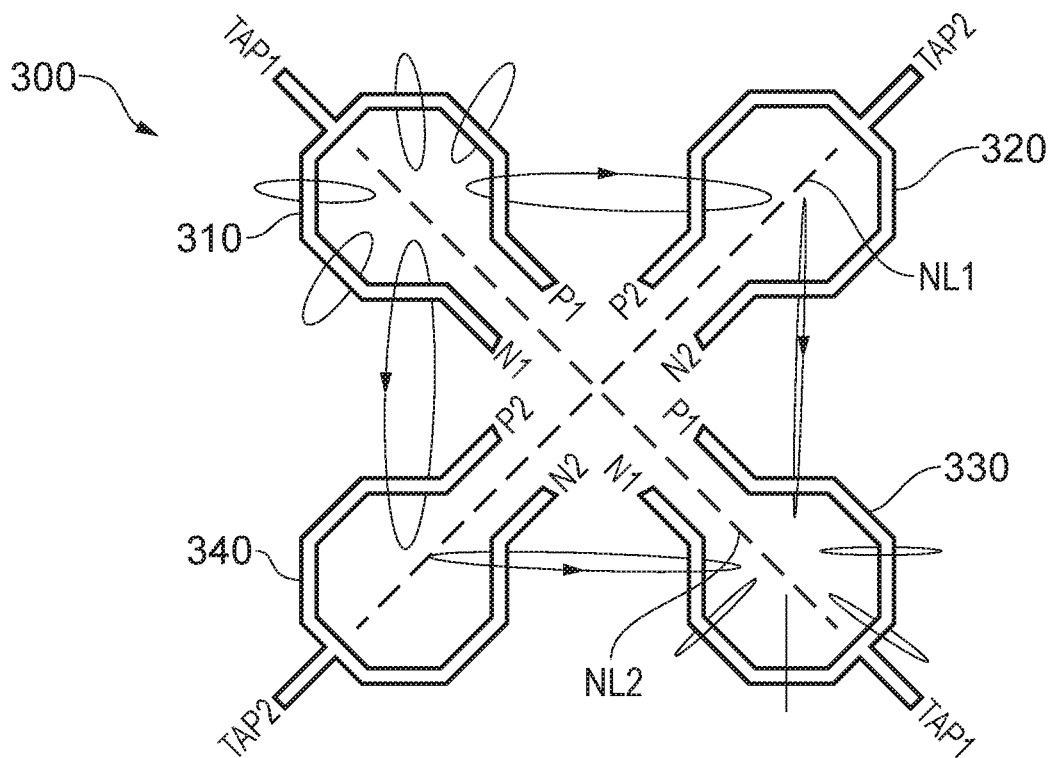
FIG. 6 is a schematic diagram illustrating the first example inductor arrangement.

FIG. 6 is a schematic diagram of the first example inductor arrangement 300 shown in FIG. 5 and additionally shows magnetic field lines of the magnetic fields generated by the inductors 310 and 330 of the first pair. The reference signs for the positive, negative and centre-tap nodes are not shown in FIG. 6 to avoid overcomplicating FIG. 6.

In a particular implementation useful for understanding the first example inductor arrangement 300, the current driving the first inductor 310 flows, in a particular instant, in the first inductor 310 in a counter-clock wise direction. As a result, the magnetic field generated by the first inductor 310 in that instant is directed out of the page in FIG. 6 (as shown by the magnetic field lines). The current driving the third inductor 330 flows, in that instant, in the third inductor 330 in a clock wise direction. Consequently, the magnetic field generated by the third inductor 330 is directed into the page in FIG. 6 (as shown by the magnetic field lines). Since the magnetic fields have opposite phases/polarities, they destructively interfere at the location of the inductors 320 and 340 of the second pair, hence the null line NL1. The location of the inductors 310, 320, 330 and 340 relative to each other ensures that each inductor 320 and 340 of the second pair is equidistant from both of the inductors 310 and 330 of the first pair, resulting in equal magnetic field magnitude (or strength or intensity) from both of the inductors 310 and 330 of the first pair. As a result, the magnetic coupling is significantly reduced (or even cancelled out).

A corresponding description applies to the effect of the magnetic fields generated by the inductors 320 and 340 of the second pair on the inductors 310 and 330 of the first pair, although not shown in FIG. 6 for simplicity.

Figure 7:
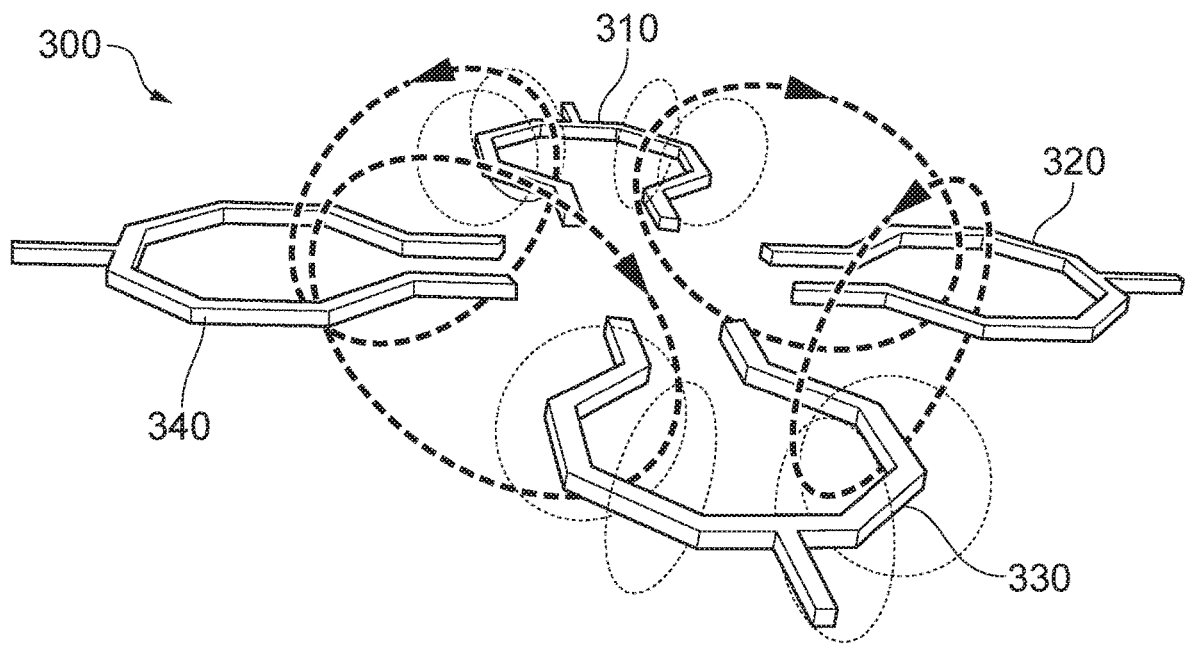
FIG. 7 is a schematic diagram illustrating the first example inductor arrangement.

FIG. 7 is a schematic diagram illustrating a perspective view of the first example inductor arrangement 300, showing the magnetic field lines also shown in FIG. 6. FIG. 7 is therefore similar to FIG. 6 and duplicate description is omitted. The reference signs and labels for the positive, negative and centre-tap nodes are not shown in FIG. 7 also to avoid overcomplicating FIG. 7.

Comparing the inductor arrangement 100 and the first example inductor arrangement 300, the first pair of inductors 310 and 330 can be considered to represent the first inductor 110 divided into two parallel inductors. Similarly, the second pair of inductors 320 and 340 can be considered to represent the second inductor 120 divided into two parallel inductors.

In the inductor arrangement 300 the inductors 310, 320, 330 and 340 are positioned relative to one another so that their centre-tap nodes 313, 323, 333 and 343 are facing away from each other, i.e. facing "outwards". In modifications of the first example inductor arrangement 300, each pair of inductors is positioned so that, for a given pair, the centre-tap nodes are arranged symmetrically opposite from one another with respect to their null line. That is, the centre-tap nodes 313 and 333 of the inductors 310 and 330 of the first pair are arranged symmetrically opposite from another with respect to the first null line NL1, and the centre-tap nodes 323 and 343 of the inductors 320 and 340 of the second pair are arranged symmetrically opposite from another with respect to the second null line NL2.

In modifications of the first example inductor arrangement 300, the positive terminals of the inductors 310 and 330 of the first pair are located on the same side of the second null line NL2 as one another and the negative terminals of the inductors 310 and 330 of the first pair are located on the same side of the second null line NL2 as one another. Alternatively or in addition, the positive terminals of the inductors 320 and 340 of the second pair are located on the same side of the first null line NL1 as one another and the negative terminals of the inductors 320 and 340 of the second pair are located on the same side of the first null line NL1 as one another.

In the inductor arrangement 300 the inductors 310, 320, 330 and 340 are shown and described as differential inductors having centre-taps. In modifications of the first example inductor arrangement 300, the inductors 310, 320, 330 and 340 are differential inductors without centre-taps. In further modifications of the first example inductor arrangement 300, the inductors 310, 320, 330 and 340 are non-differential inductors. The description above relating to the reduced coupling between the inductors 310, 320, 330 and 340 applies equally in any case.

In the example arrangement 300, the inductors 310, 320, 330 and 340 are shown and described as being located relative to one another so that their centres define four corners of a square. In modifications of the first example inductor arrangement 300, the inductors 310, 320, 330 and 340 are located relative to one another so that the first and second null lines NL1 and NL2 intersect and so that the inductors 310 and 330 of the first pair are located substantially on the second null line NL2 and the inductors 320 and 340 of the second pair are located substantially on the first null line NL1 (but not necessarily so that the their centres define four corners of a square). The inductors 310, 320, 330 and 340 may be located so that their centres define four corners of a rhombus, for example.

In the example arrangement 300, the inductors 310, 320, 330 and 340 can be considered to be "identical" (i.e. have the same size and number of turns as each other) and as being "driven" by the same current (i.e. currents of the same magnitude). In modifications of the first example inductor arrangement 300, the inductors 310 and 330 of the first pair are identical to one another and are driven by the same current, and the inductors 320 and 340 of the second pair are identical to one another and are driven by the same current as one another, but the inductors 310 and 330 of the first pair are not identical to and/or not driven by the same current as the inductors 320 and 340 of the second pair. In further modifications of the first example inductor arrangement 300, the inductors of a given pair are not identical to one another and are not driven by the same current, but nonetheless produce magnetic fields so that the magnetic field produced by one inductor 310, 320, 330 and 340 of the pair has the same strength as the magnetic field produced by the other inductor 310, 320, 330 and 340 of the pair. In this case, since the magnetic fields have same strength (and/or spatial distribution) as one another as described above, the null line between the inductors 310, 320, 330 and 340 of that given pair is straight.

In modifications of the first example inductor arrangement 300, the magnetic field produced by one inductor 310, 320, 330 and 340 of the pair has a different strength to the magnetic field produced by the other inductor 310, 320, 330 and 340 of the pair. In this case, the null line between the inductors 310, 320, 330 and 340 of that given pair is not straight—nonetheless, the inductors 310, 320, 330 and 340 in such modified example arrangements are still located relative to one another so that the inductors 310 and 330 of the first pair are located substantially on the second null line NL2 and the inductors 320 and 340 of the second pair are located substantially on the first null line NL1. Thus the effects of magnetic coupling are reduced.

The phases of the magnetic fields produced by the inductors 310, 320, 330 and 340 depend on the direction of the winding of the inductor generating that magnetic field, and on the current driving that inductor. It will be appreciated that the inductor arrangement 300 can be driven and/or the inductor winding directions can be set accordingly to give rise to magnetic fields with phases described above, whether or not the inductors of each pair are connected together as described with respect to the first example inductor arrangement 300. The inductors 310, 320, 330 and 340 are shown as each having a single turn. The inductors 310, 320, 330 and 340 could have multiple turns. The strength (intensity) of each of the magnetic fields generated by the inductors 310, 320, 330 and 340 depends on the sizes and numbers of turns of the inductors 310, 320, 330 and 340 and the currents driving the inductors 310, 320, 330 and 340, which can be set accordingly to produce magnetic fields with particular strengths.

In any of the first example inductor arrangement 300 and associated modifications thereof the inductors 310, 320, 330 and 340 of a given pair (or of both pairs) may not be connected as described above. Whether or not the inductors 310, 320, 330 and 340 are connected as described above, the currents driving the inductors could be set to be the same or different as described above.

Figure 8:
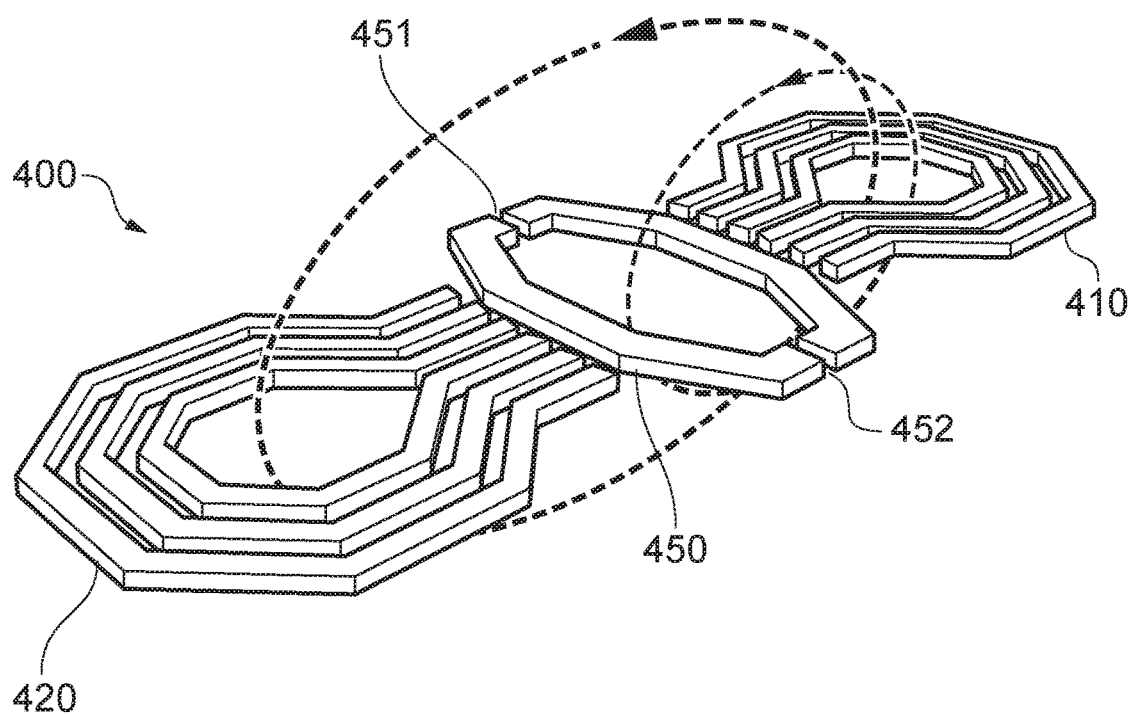
FIG. 8 is a schematic diagram illustrating a second example inductor arrangement.

FIG. 8 is a schematic diagram of a second example inductor arrangement 400 embodying the present invention.

The inductor arrangement 400 comprises a first driven inductor 410, a second driven inductor 430 and an auxiliary loop 450. The first and second driven inductors 410 and 420 are configured to be driven by first and second driving signals (which cause corresponding driving currents to flow through those inductors), respectively.

That is, the first and second driven inductors 410 and 420 (as with the other driven inductors herein) are configured to be electrically driven by driving circuitry (not shown), i.e. by conductive connections to those inductors (allowing for capacitive connections) rather than by magnetic induction. The inductor arrangements disclosed herein could be understood to comprise such driving circuitry (or the driving circuitry could be provided separately for connection to the inductor arrangements). The particular origin of the driving currents depends on circuitry in which the inductor arrangements are implemented and is not important for the purpose of this disclosure.

As before, the driving signals (voltages/currents) may have an AC component so that the generated magnetic fields do too.

The auxiliary loop 450 may be considered to comprise terminals which are connected together. In particular, the auxiliary loop 450 is or defines a closed AC and/or DC current path. The auxiliary loop 450 may also be referred to as an endless AC and/or DC current path in the sense that AC and/or DC currents induced therein will circulate around the loop of the auxiliary loop 450. The auxiliary loop 450 forms a closed loop and may be referred to as a closed-loop, or as a loop, or as a loop structure, and in the present example forms a ring or loop shape. The auxiliary loop 450 may be implemented as an inductor, and in this sense may be referred to as a closed-loop inductor or a loop inductor or inductor structure.

The auxiliary loop 450 is not configured to be driven by an AC driving current in the sense of the driven inductors. That is, the auxiliary loop 450 is not driven by an AC current except by virtue of the magnetic fields produced by the first and second driven inductors (as described more fully below, i.e. by induction). In other words, the auxiliary loop 450 is not driven by any AC current provided by circuitry not shown in FIG. 8, and may be described as electrically undriven. In this sense, the auxiliary loop 450 is "undriven" and when implemented as an inductor may be referred to as an undriven inductor or an electrically undriven inductor. The auxiliary loop 450 may be connected to a DC voltage source, to bias its voltage rather than leave it "floating". The auxiliary loop 450 may be left floating or connected to a fixed potential. The auxiliary loop 450 may be referred to as a magnetic trap or conductive ring or loop.

Similarly to before, the inductors 410 and 420 may be driven by a set of quadrature voltage signals, conveniently referred to as I, /I, Q and /Q, where these have respective (relative) phases 0, 180, 90 and 270 degrees. In this example, the I and /I signals may be applied to the respective terminals of the inductor 410, and the Q and /Q signals may be applied to the respective terminals of the inductor 420. The inductors 410 and 420 may be center tapped for example, although not shown.

In this example, the resultant currents flowing in the inductors 410 and 420 may be 90 or 270 degrees out of phase. Thus, the resultant magnetic fields generated by the inductors 410 and 420 may also be 90 or 270 degrees out of phase. Such an arrangement may be referred to as an I/Q arrangement.

FIG. 8 shows magnetic field lines of a first driven magnetic field produced by the first driven inductor 410. The first driven magnetic field is present at the location of the second driven inductor 420 and the auxiliary loop 450 as shown by the field lines in FIG. 8. The first driven magnetic field induces a current in the auxiliary loop 450, which may be referred to as a first auxiliary current. That is, a magnetic flux of the first driven magnetic field couples to the auxiliary loop 450, causing a back-EMF in the auxiliary loop 450 which causes the first auxiliary current to flow in the auxiliary loop 450. The first auxiliary current induced in the auxiliary loop 450 then produces or generates a first auxiliary magnetic field in the auxiliary loop 450. That is, the auxiliary loop 450 generates a first auxiliary magnetic field due to the first auxiliary current flowing in the auxiliary loop 450 induced by the first driven magnetic field.

According to Lenz's law, the first auxiliary magnetic field produced by the auxiliary loop 450 has opposite polarity to the first driven magnetic field (i.e. the first driven magnetic field and the first auxiliary magnetic field have opposite phases). Thus the first driven magnetic field and the first auxiliary magnetic field destructively interfere at (the location of) the second driven inductor 420. Consequently, the effects due to coupling from the first driven inductor 410 to the second driven inductor 420 are reduced. The dimensions of the inductors 410, 420 and 450 and their relative locations with respect to each other are set so that the effect of the first driven magnetic field at (the location of) the second driven inductor 420 is at least partially cancelled out (and preferably, cancelled out as much as possible) by the effect of the first auxiliary magnetic field at (the location of) the second driven inductor 420.

Figure 9:
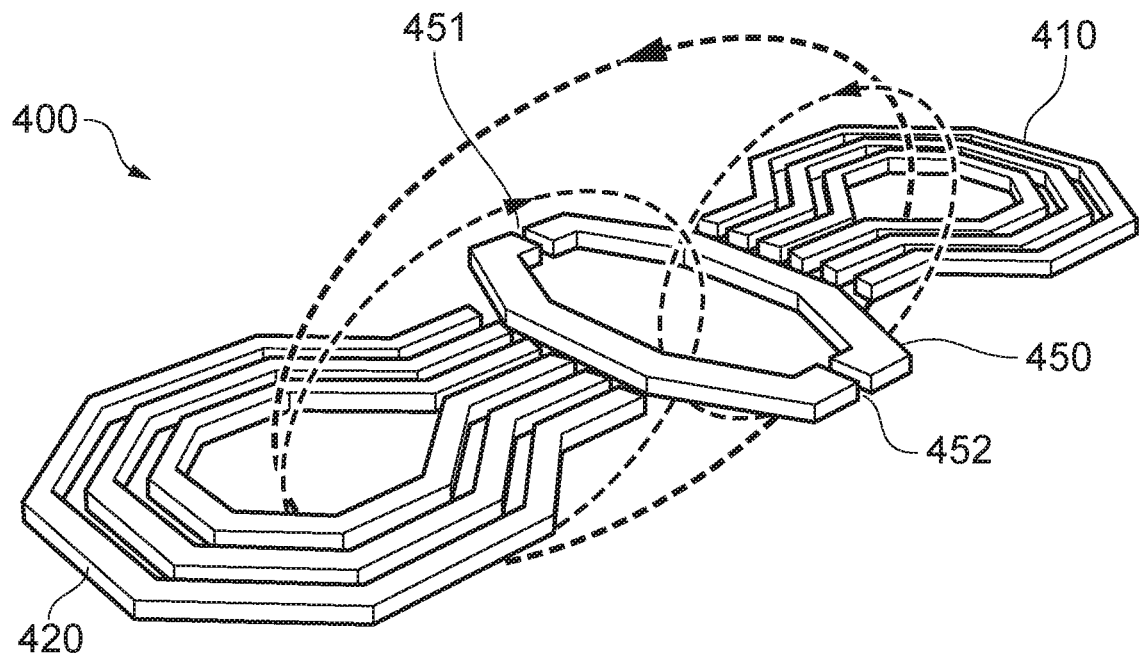
FIG. 9 is a schematic diagram illustrating the second example inductor arrangement.

FIG. 9 is a schematic diagram of the second example inductor arrangement 400. FIG. 9 is the same as FIG. 8 except FIG. 9 additionally shows a magnetic field line of the first auxiliary magnetic field.

Figure 10:
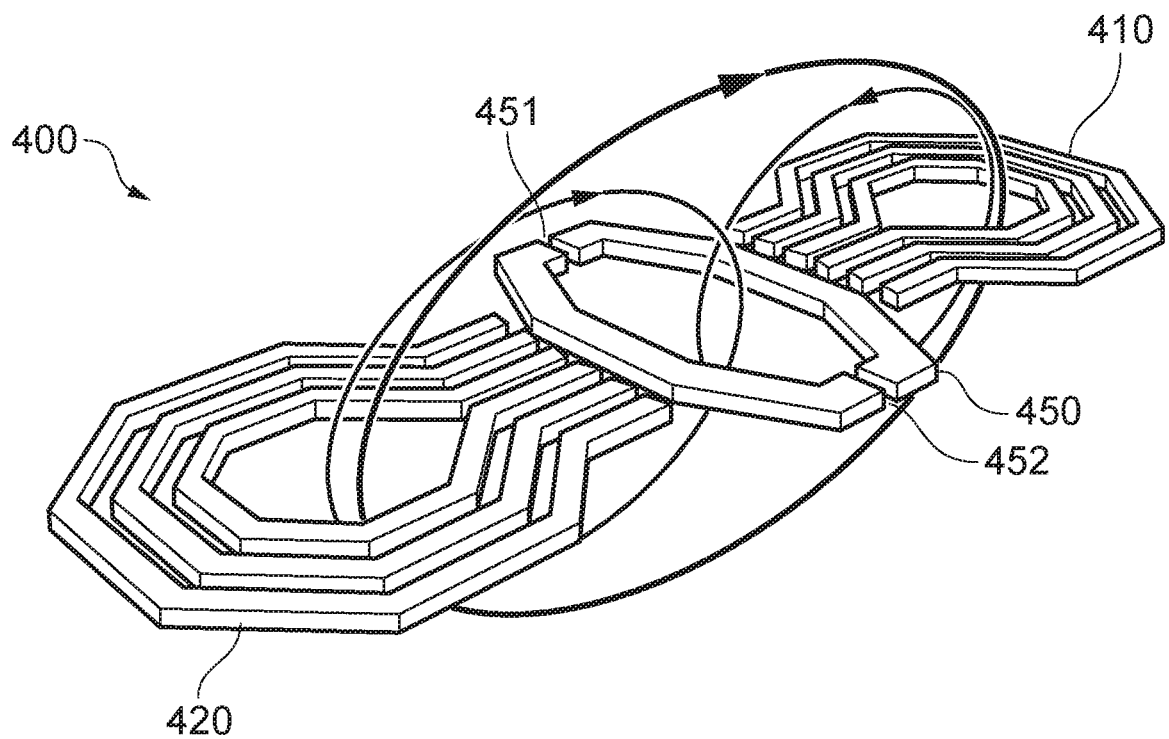
FIG. 10 is a schematic diagram illustrating the second example inductor arrangement.

FIG. 10 is a schematic diagram of the second example inductor arrangement 400. FIG. 10 shows magnetic field lines of a second driven magnetic field and a magnetic field line of a second auxiliary magnetic field. The second driven magnetic field is produced by the second driven inductor 420 due to the second driving current driving the second driven inductor 420. Similarly to the above description of the first driven magnetic field and the first auxiliary magnetic field, the second driven magnetic field induces a second auxiliary current in the auxiliary loop 450 which produces a second auxiliary magnetic field. That is, the auxiliary loop 450 is configured to have a second auxiliary current induced therethrough by virtue of the second driven magnetic field produced by the second driven inductor 420 and thereby produce a second auxiliary magnetic field. The second auxiliary magnetic field and the second driven magnetic field have opposite polarities, i.e. opposite phases, to one another, and therefore interfere destructively at (the location of) the first driven inductor 410. Consequently, the effects due to coupling from the second driven inductor 420 to the first driven inductor 410 are reduced. The dimensions of the inductors 410, 420 and 450 and their relative locations with respect to each other are set so that the effect of the second driven magnetic field at (the location of) the first driven inductor 410 is at least partially cancelled out (and preferably, cancelled out as much as possible) by the effect of the second auxiliary magnetic field at (the location of) the first driven inductor 410.

In the above description of the first and second driven magnetic fields and the first and second auxiliary magnetic fields, it will be appreciated that, since the driving signals and currents have AC components the magnetic fields will alternate or fluctuate. Therefore, it will be understood in FIGS. 8 to 10 (and in the other Figures showing field lines with directions) that the field-line directions alternate over time.

Although not shown in FIGS. 8 to 10 to avoid over complicating them, the first and second driven magnetic fields and the first and second auxiliary magnetic fields exist at the same time (although the first driven and auxiliary magnetic fields may be 90 or 270 degrees out of phase with the second driven and auxiliary magnetic fields, as mentioned earlier) and thereby coupling between the first and second driven inductors 410 and 420 is (mutually) reduced or cancelled. It will be appreciated that the first driven and auxiliary magnetic fields do not need to be 90 or 270 degrees out of phase with the second driven and auxiliary magnetic fields.

The auxiliary loop 450 shown in FIG. 10 comprises breaks or gaps 451 and 452 in its conductor, which correspond to capacitors in series with portions of the conductor, or in series along the conductor. The number and/or sizes of these breaks can be set (controlled) to control the intensity (i.e. strength) of the first and second auxiliary magnetic fields, for example to reduce the magnetic coupling between the first and second driven inductors 410 and 420. Controlling the number and/or sizes of the breaks is equivalent to controlling the series capacitance, and thus the AC performance.

The second example inductor arrangement 400 has been described as comprising two driven inductors 410 and 420. In modifications of the second example arrangement 400, the second driven inductor 420 is target circuitry. In this case, the effect of the first driven magnetic field at (the location of) the target circuitry 420 is cancelled out by the effect of the first auxiliary magnetic field at (the location of) the target circuitry 420. Therefore the target circuitry 420, the operation of which may be undesirably affected by a magnetic field (e.g. coupling from the first driven magnetic field), is able to operate substantially without being affected by (or with reduced effect from) that magnetic field. The target circuitry 420 may be an inductor. The target circuitry 420 may be a driven inductor, as described earlier, but the effect of a magnetic field generated by the target circuitry 420 at the first driven inductor 410 might not be important in some applications. In simpler terms, the effect at the first driven inductor 410 of the second driven magnetic field generated by the second driven inductor 420 may not be important in some situations. The relative locations and sizes of the first and second driven inductors 410 and 420 and the auxiliary loop 450 may therefore be set accordingly.

In the second example inductor arrangement 400, the auxiliary loop 450 is located between and equidistant from the first and second driven inductors 410 and 420, and the first and second driven inductors and the auxiliary loop 410, 420 and 450 are located at respective positions along a straight line. The relative locations of the first and second driven inductors 410 and 420 and the auxiliary loop 450 with respect to each other may, in modifications of the second example arrangement 400, be different to the locations shown in FIGS. 8 to 10. For example, the auxiliary loop 450 may be located between the first and second driven inductors 410 and 420 but the first and second driven inductors and the auxiliary loop 410, 420 and 450 may not be located at respective positions along a straight line. Alternatively or additionally, the auxiliary loop 450 may not be equidistant from the first and second driven inductors 410 and 420 (for example when the first and second driven inductors 410 and 420 are not identical to one another).

It will be appreciated that in modified examples which comprise target circuitry 450 (or modified examples in which the effect at the first driven inductor 410 of the second driven magnetic field generated by the second driven inductor 420 is not important) the relative locations are even less restricted.

In the second example inductor arrangement 400, the auxiliary loop comprises the breaks 451 and 452. In modifications of the second example inductor arrangement 400, the conductor of the auxiliary loop 450 may comprise no breaks, or comprise any number of breaks. As mentioned above, the auxiliary loop 450 is a closed (or endless) AC and/or DC current path. More specifically, when the auxiliary loop 450 comprises one or more breaks or gaps 451 and 452 in its conductor, the auxiliary loop 450 is a closed (or endless) AC current path. When the auxiliary loop 450 comprises no breaks or gaps 451 and 452 in its conductor (i.e. no capacitors), the auxiliary loop 450 is a closed (or endless) AC and/or DC current path.

The strengths (intensities and/or field distributions) of the first and second driven magnetic fields depend on a number of factors including the first and second driving currents and the number of turns and sizes of the first and second driven inductors 410 and 420. The strengths (intensities) of the first and second auxiliary magnetic fields depend on a number of factors including the first and second driving currents, the number of turns and sizes of the first and second driven inductors 410 and 420 and of the auxiliary loop 450, and the relative locations of the first and second driven inductor 410 and 420 and the auxiliary loop 450. The exact dimensions and relative locations of elements of the second example inductor arrangement 400 may, in practice, be set by performing simulations for optimum performance.

In some implementations, the phase difference between the phases of the first and second driven magnetic fields is substantially 90 or 270 degrees for IQ operation as mentioned earlier. The phases of the first and second driven magnetic fields may be the same as one another. Of course, other phase differences are possible.

In modifications of the second example inductor, the first and second driven inductors 410 and 420 are differential inductors.

The first and second driven inductors 410 and 420 are shown in FIGS. 8 to 10 as having multiple turns. The first and second driven inductors 410 and 420 could have any number of turns (including one) and they could have different numbers of turns from one another. The strengths (intensities and/or field distributions) of the first and second driven magnetic fields may be the same as or different from one another.

Figure 11:
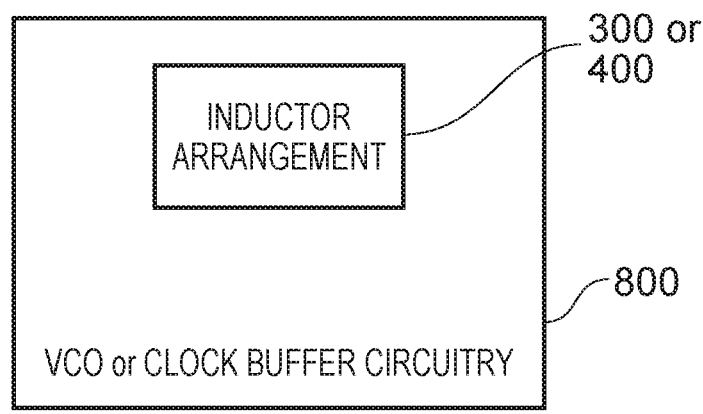
FIG. 11 is a schematic diagram of voltage-controlled oscillator (VCO) or clock buffer circuitry.

It will be appreciated that the first or second example inductor arrangement 300 or 400 (or any associated modifications) could be implemented in oscillator (such as VCO) or clock buffer circuitry 800, as shown in FIG. 11. The VCO or clock buffer circuitry 800 may be I/Q circuitry.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

Figure 12:
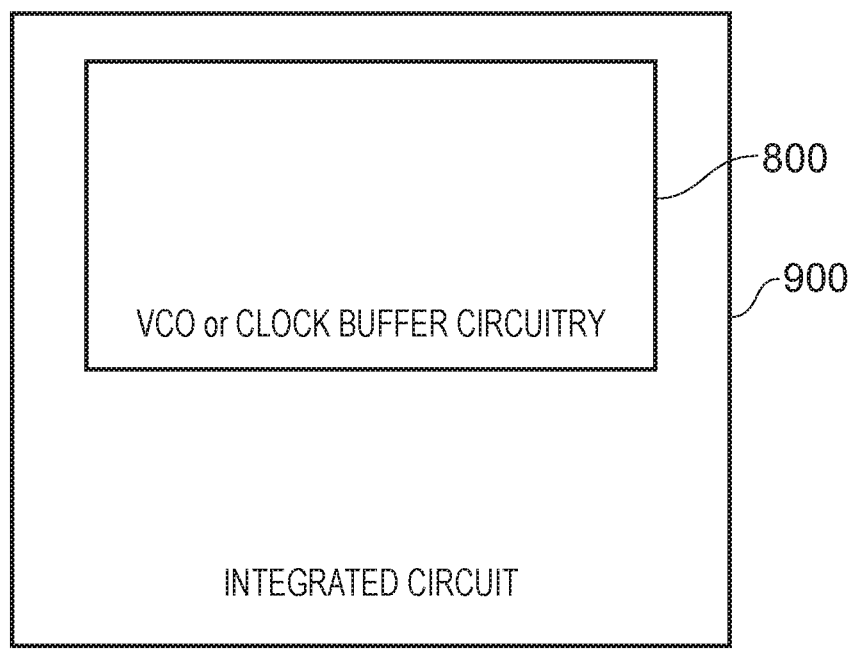
FIG. 12 is a schematic diagram of an integrated circuit.

FIG. 12 is a schematic diagram of an integrated circuit 900 comprising the VCO or clock buffer circuitry 800.

FIG. 13 is a schematic diagram of I/Q oscillator circuitry 100 (which may be implemented as a VCO, although not explicitly shown) comprising the inductor arrangement 300 or 400, useful for better understanding possible applications of the present invention. For consistency with the examples mentioned earlier, a set of quadrature voltage signals, conveniently referred to as I, /I, Q and /Q are shown at output nodes of the circuitry 100 and thus applied to terminals of the inductors of the arrangement 300 or 400 as described earlier. The skilled person will understand that the transformer coupling at the tail nodes of the two oscillator cells enables the IQ operation. I/Q circuitry 100 accordingly comprises the first and second driven inductors 410 and 420 of the second example inductor arrangement 400 (along with the auxiliary loop 450, which is not shown), or the first and second pairs of inductors 310 and 330, and 320 and 340 (with the understanding that each pair can be considered as one inductor divided into two parallel inductors). FIG. 13 is schematic and does not show the true relative location of the inductors, which corresponds to the relative locations illustrated in FIGS. 5 and 8.

Further embodiments may be provided within the spirit and scope of the present invention as disclosed herein.

The invention claimed is:

1. Integrated circuitry having one or more layers and comprising an inductor arrangement, the inductor arrangement comprising:
   a first pair of driven inductors configured to produce magnetic fields which are substantially in antiphase, and arranged relative to one another so that their magnetic fields substantially cancel one another at a first null line between those inductors; and
   a second pair of driven inductors configured to produce magnetic fields which are substantially in antiphase, and arranged relative to one another so that their magnetic fields substantially cancel one another at a second null line between those inductors,
   wherein the pairs of driven inductors are arranged relative to one another so that the first and second null lines intersect one another, with the first pair of driven inductors located substantially on the second null line and the second pair of inductors located substantially on the first null line, wherein the first and second pairs of inductors are formed in the same layer of the integrated circuitry, wherein the inductors of the first and second pairs all have the same size and number of turns as each other, wherein the driven inductors of the first and second pairs are differential inductors, wherein one of the driven inductors of the first pair includes a first centre-tap node, and the other of the driven inductors of the first pair includes a third centre-tap node, wherein one of the driven inductors of the second pair includes a second centre-tap node, and the other of the driven inductors of the second pair includes a fourth centre-tap node, and wherein the driven inductors of the first pair are centre-tapped with the first and third centre-tap nodes of the driven inductors of the first pair being electrically connected together, and the driven inductors of the second pair are centre-tapped with the second and fourth centre-tap nodes of the driven inductors of the second pair being electrically connected together.

2. The integrated circuitry as claimed in claim 1, wherein:

the first pair of driven inductors are connected together to be driven by the same first driving signal; and/or the second pair of driven inductors are connected together to be driven by the same second driving signal, optionally wherein a phase difference between the first and second driving signals is substantially 90 or 270 degrees.

3. The integrated circuitry as claimed in claim 1, wherein the positions of the driven inductors of the first and second pairs define four corners of a rhombus or square, the driven inductors of the first pair being opposite from one another in the arrangement.

4. The integrated circuitry as claimed in claim 1, wherein the driven inductors have positive and negative terminals, and wherein:

the positive terminals of the driven inductors of the first pair are connected together and the negative terminals of the driven inductors of the first pair are connected together; and/or the positive terminals of the driven inductors of the second pair are connected together and the negative terminals of the driven inductors of the second pair are connected together; and/or the positive terminals of the driven inductors of the first pair are located on the same side of the second null line as one another and the negative terminals of the driven inductors of the first pair are located on the same side of the second null line as one another; and/or the positive terminals of the driven inductors of the second pair are located on the same side of the first null line as one another and the negative terminals of the driven inductors of the second pair are located on the same side of the first null line as one another; and/or the positive and negative terminals of each driven inductor of the first pair are located on opposite sides of the second null line from one another; and/or the positive and negative terminals of each driven inductor of the second pair are located on opposite sides of the first null line from one another.

5. The integrated circuitry as claimed in claim 1 comprising I/Q circuitry, such as I/Q clock buffer circuitry or I/Q voltage-controlled oscillator circuitry, the I/Q circuitry comprising the inductor arrangement.

* * * * *